United States Patent

La Fleur et al.

[11] Patent Number: 5,903,041
[45] Date of Patent: May 11, 1999

[54] INTEGRATED TWO-TERMINAL FUSE-ANTIFUSE AND FUSE AND INTEGRATED TWO-TERMINAL FUSE-ANTIFUSE STRUCTURES INCORPORATING AN AIR GAP

[75] Inventors: Michael David La Fleur; Ralph Whitten; Chun-Mai Liu, all of San Jose, Calif.; Alan E. Comer, Sumner, Wash.; Scott Graham, Los Gatos, Calif.; Yu-Lin Lee, Taipei, Taiwan

[73] Assignee: Aptix Corporation, San Jose, Calif.

[21] Appl. No.: 08/263,920

[22] Filed: Jun. 21, 1994

[51] Int. Cl.$^6$ .......................... H01L 29/04; H01L 27/10; H01L 29/00

[52] U.S. Cl. .......................... 257/530; 257/50; 257/209; 257/210; 257/211; 257/528; 257/529

[58] Field of Search .................. 257/209, 529, 257/530, 50, 210, 211, 528

[56] References Cited

U.S. PATENT DOCUMENTS

| | | | |
|---|---|---|---|
| 4,198,744 | 4/1980 | Nicolay | 29/623 |
| 4,441,167 | 4/1984 | Principi | 365/94 |
| 5,412,593 | 5/1995 | Magel et al. | 365/96 |
| 5,451,811 | 9/1995 | Whitten et al. | 257/530 |

*Primary Examiner*—Valencia Wallace
*Attorney, Agent, or Firm*—D'Alessandro & Ritchie

[57] ABSTRACT

A two-terminal fuse-antifuse structure comprises a horizontal B-fuse portion and a vertical A-fuse portion disposed between two metallization layers of an integrated circuit device. The two-terminal fuse-antifuse can be programmed with a relatively high current applied across the two terminals to blow the B-fuse, or with a high voltage applied across the two terminals to program the A-fuse. Such a device, connected between two circuit nodes, initially does not provide an electrical connection between the two circuit nodes. It may then be programmed with a relatively high voltage to blow the A-fuse, causing it to conduct between the two circuit nodes. Then, upon application of a relatively high current between the two circuit nodes, the B-fuse will blow, making the device permanently non-conductive. An improvement permitting higher current programming of B-fuses either alone or as part of Ab-fuse structures, incorporates an air gap which provides a pocket of space either above, below or both above and below the B-fuse portion of the device. This air gap provides a place for material disrupted (melted or vaporized) by a fuse or Ab-fuse programming event to go, eliminates direct contact between the dielectric material and the fuse-portion of the device, and also thermally isolates the melted fuse material from the dielectric, thus reducing the physical stress within the dielectric itself associated with high current programming and avoiding undesired collateral damage normally associated with high current programming events. The creation of an air gap around the fuse neck is accomplished by the removal of a sacrificial layer of an oxidizable polymer material in a gaseous and/or plasma state through a small hole in the dielectric referred to as a sacrificial via opening or just "sacrificial via". After removal of the oxidizable polymer material through the sacrificial via, the sacrificial via is sealed with a passivation layer formed of a polymeric material to prevent damage to the underlying structure. The integration of the air gap and sacrificial via sealing into the current fuse process manufacturing requires the following additional processing steps: (1) Air gap definition; (2) Air gap evacuation with oxygen plasma; (3) the application of the sealing polymer; and (4) the curing of the sealing polymer.

52 Claims, 5 Drawing Sheets

INTEGRATED TWO-TERMINAL FUSE-ANTIFUSE AND FUSE AND INTEGRATED TWO-TERMINAL FUSE-ANTIFUSE STRUCTURES INCORPORATING AN AIR GAP

BACKGROUND OF THE INVENTION

1. Field of the Invention

The present invention relates to integrated circuit technology. More particularly, the present invention relates to electrically programmable interconnect technology and to electrically programmable interconnect elements suitable for fabrication as a part of a fabrication process for integrated circuits, hybrids, multichip modules, and interconnect structures on insulating or conductive substrates and the like. Still more particularly, and according to a first aspect of this invention, it relates to the field of integrated two-terminal fuse-antifuse ("Ab-fuse") structures used in one-time field programmable electrically programmable circuits contained in such integrated circuit devices. Still more particularly, and according to a second aspect of this invention, it relates to the incorporation of air gaps in fuse and fuse-antifuse structures for improved reliability of the programmed fuses and fuse-antifuses.

2. The Prior Art

Numerous schemes for providing integrated circuit interconnections are known in the prior art. Various ones of these schemes relate to electrically programmable interconnections for use in integrated circuits, wherein a plurality of potential interconnection points are fabricated into an integrated circuit during the manufacturing process, but the particular interconnections between circuit nodes in the integrated circuit are made by the user by electrically programming selected ones of the interconnections so that desired connections between circuit nodes are made while other potential interconnections are deliberately unrealized.

There are several types of electrically programmable interconnect schemes which are currently available to the integrated circuit user. One type of electrically programmable interconnect is reprogrammable, and can be altered by a user after initial circuit configuration has been accomplished. This type of interconnect may be implemented by simple transistors whose gate voltages are controlled to determine the interconnections to be made, or by one form or another of non-volatile memory devices, such as EPROMS, EEPROMS, NOVRAMS, or combinations of both simple transistors and non-volatile memory elements. An example of a technology for implementing this type of interconnect is found in U.S. Pat. No. 4,870,302 to Freeman.

Another type of electrically programmable interconnection is one-time programmable, and once initially configured, may not be reconfigured. The most popular examples of this type of electrically programmable interconnect may take one of two forms, a first form, normally short circuited until rendered an open circuit as a result of a programming procedure, and a second form normally open circuited until rendered a short circuit as a result of a programming procedure.

The first form of one-time electrically programmable interconnect is usually referred to as fuse technology, and is exemplified by the disclosure found in U.S. Pat. No. 4,796,075 to Whitten. The second form of one-time electrically programmable interconnect is usually referred to as "antifuse" technology, and is exemplified by the disclosures found in U.S. Pat No. 4,823,181 to Mohsen et al., U.S. Pat No. 4,899,205 to Hamdy et al., and European Patent Application No. 90309731.9, Publication No. 0 416 903 A2, to Whitten et al.

While each form of one-time electrically programmable interconnect technology has been and continues to be useful in numerous integrated circuit applications, there remains room for improvement of this technology. For example, interconnect networks comprising fuse technology initially present a network of connected nodes. Fuses connecting unwanted circuit paths are then programmed by applying a voltage or current source across them. One disadvantage of this method is that other fuses in the interconnection network which are not to be programmed are in the current path of the fuse to be programmed. Depending on the configuration of the particular network, these "sneak" paths for current can be significant enough to require a large amount of current to be supplied to program the desired fuses. Typically, blocking diodes are employed to eliminate sneak paths. Blocking diodes require a semiconductor substrate in which to form the diode and add to the area and complexity of the integrated circuit device containing them.

When antifuse technology is used, care must be taken to avoid the inadvertent programming of antifuses which are intended to remain unprogrammed. In some cases, the existence of parallel current and voltage paths through the potential interconnection networks raises the possibility of stressing antifuses which are to remain unprogrammed. Overly stressed antifuses may inadvertently become programmed, or may become so weakened that they will present a reliability problem and shorten the operating lifetime of the circuit in which they are used. This consideration necessitates careful design of the programming process and may also affect circuit design considerations.

Fuses have been widely used in integrated circuits as electrically programmable elements for providing a variety of functions including, for example, programmable logic devices, circuit redundancy circuits and circuit trimming. There are two structures of fuses commonly used in integrated circuits: the first structure embodies a patterned conductor film which is embedded between two dielectric layers; the second structure embodies a patterned conductor film with the top-side of the fuse exposed (no dielectric protection). The former structure has often been used in electrically programmable products such as Proms and PALs, while the latter structure is often found in analog circuit products for circuit trimming, or in memory circuit products for circuit redundancy.

In the case of PROMs or PALs, fuses are typically used as pull-downs in the transistor array, hence, only moderately low resistance is needed to pull the gates to ground (typically in the range of 25 to 75 ohms). In such applications the metal film fuses may be constructed to open under the dielectric upon application of a moderate programming current across the fuse terminals (typically tens of milliamperes). Since the fuse thickness in this application is thin (on the order of a few hundred angstroms thick) in comparison to the overlaying dielectric (which is typically one to several microns thick) and the fuse width is moderate (typically on the order of about 2 microns wide), the dielectric remains intact after fuse programming, even though the fuse material is redistributed during the fuse programming event.

Figure 1:
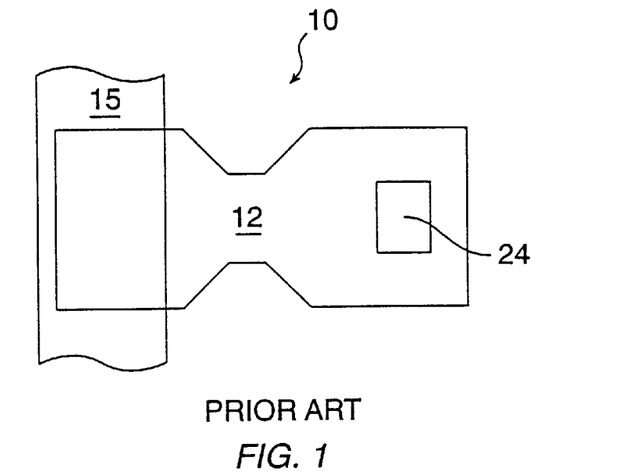
FIGS. 1 and 2 a prior art horizontal B-fuse device.
Figure 2:
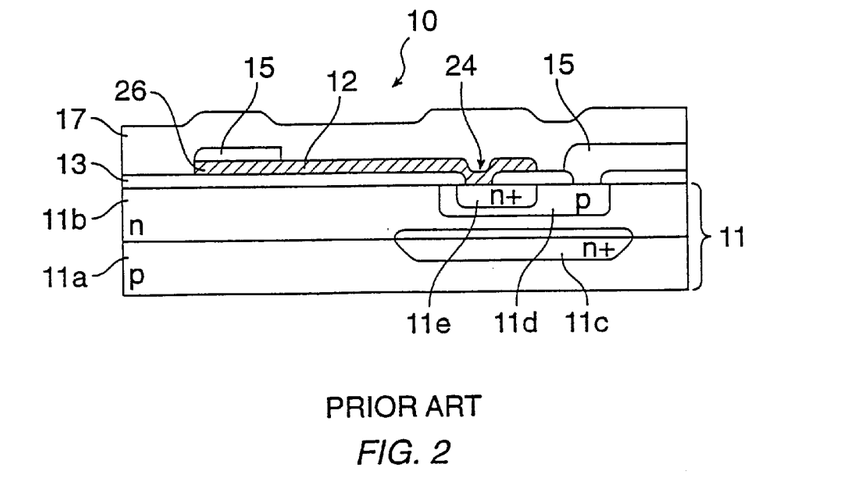

Turning now to the drawings, FIGS. 1 and 2 depict, respectively, a top and a cross-sectional view of a conventional horizontal blowable fuse 10 according to the prior art. The structure is built over a substrate 11 which is a silicon wafer comprising a p-type silicon substrate 11a and an n-type epitaxial silicon layer 11b. An n$^+$-type buried layer 11c, a p-type base region 11d and an n$^+$-type emitter region 11e are formed in the substrate. An oxide layer 13 is deposited over the substrate 11. A first via 24 is opened in oxide layer 13 and conductive fuse material layer 26 is deposited which comprises fuse neck 12 as shown in FIG. 1. A metallization layer 15 is then deposited to provide electrical contacts to the fuse structure 10. An oxide interlayer dielectric layer 17 is then disposed over the structure 10. Additional metal interconnect layers may then be constructed. In this device there is no air gap above, below or surrounding fuse neck 12. Interlayer dielectric oxide layer 17 is in direct contact with the fuse material at fuse neck 12. As a result, if the fuse material is more than a few hundred angstroms thick or wider than a few $\mu$m, then oxide layer 17 may suffer melting or other disruption during the blowing of fuse 10 at fuse neck 12 during a programming operation and, if the energy dissipated in the fuse blowing incident is sufficient, oxide layer 17 may be cracked, broken or otherwise destroyed rendering the device at least partially inoperative.

While fuses are well known in the prior art, there is a need for a compact, two-terminal Ab-fuse which has an "ON" resistance of less than 2 ohms. Such a device, connected between two circuit nodes, initially does not provide an electrical connection between the two circuit nodes. It may then be programmed with a voltage to blow the "A-fuse" (antifuse), causing it to conduct between the two circuit nodes. Then, upon application of a current between the two circuit nodes, the fuse portion or "B-fuse" (blowable fuse) will blow, making the device permanently non-conductive.

There is also a need in the art for a method of constructing a B-fuse or the B-fuse portion of an Ab-fuse so that in a high current programming event, it does not damage the integrated circuit. A desirable technique is to incorporate isolation between the B-fuse and the dielectric layer, in the form of an air gap, to provide a volume in which disrupted fuse material may dissipate and also provide a physical and thermal isolation between the fuse and the dielectric.

Several prior art patents address the construction of various types of gap-like structures in integrated circuit structures, however, although fit for their intended purposes, these structures do not meet the requirements of providing a low cost method for fabricating a fuse with an air gap between two layers of metal interconnect. Fritzinger et al., U.S. Pat. No. 3,647,585, describes an air gap formed by depositing a conductor over a compressively stressed layer which is in turn over a metal layer which can be under-etched. By under-etching the metal layer until it disappears, the compressive layer will force the upper layers away from the substrate leaving an air gap and breaking any pinhole shorts which may be present. This method requires several complex metal layers and provides an unpassivated bridge structure unsuitable for use with integrated circuit fuses.

Bierig, U.S. Pat. No. 4,032,949, describes a fuse element surrounded by air. The structure is formed by forming three or more layers of chemically dissimilar materials over a region in which the fuse is to be formed. The top layers are then etched away from the region where the fuse is to be formed leaving the lower two layers, the top one of which forms the actual fuse. The lower layer is then etched away leaving the fuse suspended from the underlying substrate. This fuse must be formed on silicon to create the suspended fuse and is thus unacceptable for use between two metal interconnect layers.

Nicolay, U.S. Pat. No. 4,198,744, describes a suspended necked fuse element. A side-etching process is used to excavate the material under the fuse. Nicolay does not provide a method for protecting the fuse from further processing or chemical attack. This passivation protection is required for high reliability integrated circuits.

te Velde et al., U.S. Pat. No. 4,460,914 describes a fuse within a cavity of an integrated circuit structure. An aluminum metal sacrificial layer is used to define the air gap. The aluminum is then coated with a metallization layer of nickel and selectively etched from the side to form a cavity. A passivation layer is then deposited over the nickel metallization layer. This process is not compatible with a top aluminum metallization layer because the sacrificial etch of the aluminum effectively eliminates the possibility of using aluminum as the metallization layer. This is an undesirable outcome as the most common processes today require aluminum as the top metallization layer. te Velde et al., U.S. Pat. No. 4,528,583 is similar to the foregoing, except that an electrostatic switch is constructed in place of the fuse within the air gap.

A prior art programmable memory circuit, which utilizes fuses and antifuses was disclosed in U.S. Pat. No. 4,441,167 to Principi. This patent discloses the use of serially connected fuses and normally high resistance programmable devices in conjunction with an integrated circuit, specifically an emitter follower transistor array. The construction of this device is not suitable for Field Programmable Interconnect Component ("FPIC") devices as it cannot be fabricated at a metal-1 to metal-2 crossover in a programmable array due to the requirement of the presence of active switching devices (i.e., transistors). The present invention is directed to a structure incorporating fuses and antifuses in an economical two (or more) level integrated circuit without the need for transistors or other active devices or substrates.

Accordingly, there is a need in the art for an improved low cost, easy to manufacture, high-current fuse and Ab-fuse structure compatible with standard integrated circuit manufacturing processes and capable of withstanding the forces and trauma associated with high-current programming while still providing low-resistance signal paths across its terminals when in a short-circuit state.

OBJECTS AND ADVANTAGES OF THE INVENTION

Recently, it has become desirable to, and is an object of the present invention to, in conjunction with Programmable Circuit boards and other programmable structures, use both fuse and anti-fuse elements together in the construction of the Field Programmable Interconnect Components or "FPICs", where the function of an anti-fuse and a fuse are built into an integrated two terminal device structure known as the "Ab-fuse". This terminology refers to the presence of an "A-fuse" or antifuse and a "B-fuse" or blowable fuse—sometimes referred to as a fusible link. In the Programmable Circuit Board application, the fuse and Ab-fuse structures are used directly in the programmed interconnection path, rather than to pull down the gate of a transistor, thus fuses of lower resistance and of higher operating current capability are desirable and crucial to the board performance as these fuses must carry the signals being switched by the interconnect circuitry. To achieve the desirable properties mentioned above, thicker (several thousand angstroms) metal films and wider fuse width (on the order of 8–30 $\mu$m) are needed. Unfortunately, when programming such a low-resistance fuse or Ab-fuse, much more energy is required to open the fuse, much more material flow and disruption is caused (in effect, a small explosion) and it has been found that passivation rupturing and other structural damage often occur as a result of some of the high fuse programming currents desired. These undesirable effects are thought to be the result of the very large stress (i.e., beyond the yield point of the dielectric oxide layer) generated from the local disruption of fuse material and the melting or vaporization of the adjacent dielectric) caused directly by the fuse programming event.

Accordingly, it is an object of the present invention to provide a novel high density, low cost, easily manufactured, two-terminal fuse-antifuse structure capable of being sequentially programmed from a non-conducting state to a conducting state to a non-conducting state which can be economically integrated into a two (or more) level metal structure.

It is another object of the present invention to provide a novel fuse structure which is capable of withstanding high-current programming while providing a low-resistance signal path while in the conducting state.

It is another object of the present invention to provide a novel fuse structure which is less prone to failure when programmed with high currents.

It is another object of the present invention to provide a novel fuse-antifuse structure which is capable of withstanding high-current programming while providing a low-resistance signal path while in the conducting state.

It is another object of the present invention to provide a novel fuse-antifuse structure which is less prone to failure when programmed with high currents.

It is another object of the present invention is to provide a fuse with an air gap above it.

It is another object of the present invention is to provide a fuse with an air gap below it.

It is another object of the present invention is to provide a fuse with an air gap above it and below it.

It is another object of the present invention is to provide a two-terminal fuse-antifuse with an air gap above the fuse portion.

It is another object of the present invention is to provide a two-terminal fuse-antifuse with an air gap below the fuse portion.

It is another object of the present invention is to provide a two-terminal fuse-antifuse with an air gap both above and below the fuse portion.

It is another object of the present invention to provide a method of forming an air gap by using a sacrificial layer of a polymeric or other oxygen plasma-etchable material.

It is another object of the present invention to provide a method of forming an air gap by using a sacrificial via to access the sacrificial layer and evacuate same.

Yet another object of the present invention to provide a method for sealing a sacrificial via after evacuation of an underlying sacrificial layer to form an air gap.

These and many other objects and advantages of the present invention will become apparent to those of ordinary skill in the art from a consideration of the drawings and ensuing description of the invention.

SUMMARY OF THE INVENTION

According to a first aspect of the present invention, a two-terminal fuse-antifuse structure comprises a horizontal B-fuse portion and a vertical A-fuse portion disposed between two metallization layers of an integrated circuit device. The two-terminal fuse-antifuse can be programmed with a relatively high current applied across the two terminals to blow the B-fuse (the current being in the range of 0.5–4.0 Amperes), or with a voltage applied across the two terminals to program the A-fuse (the voltage being in the range of 7–100 Volts). Such a device, connected between two circuit nodes, initially does not provide an electrical connection between the two circuit nodes. It may then be programmed with a voltage to blow the A-fuse, causing it to conduct between the two circuit nodes. Then, upon application of a relatively high current between the two circuit nodes, the B-fuse will blow, making the device permanently non-conductive.

According to a second aspect of the present invention, in order to overcome the difficulties described above in implementing a low-resistance fuse structure, a new structure, called the air gap or air chamber is provided which provides a pocket of space either above, below or both above and below the B-fuse portion of the device. This air gap provides a place for material disrupted (melted or vaporized) by a B-fuse or Ab-fuse programming event to go, eliminates direct contact between the dielectric material and the B-fuse portion of the device, and also thermally isolates the melted fuse material from the dielectric, thus reducing the physical stress within the dielectric itself associated with high current programming and avoiding undesired collateral damage normally associated with high current programming events. The creation of an air gap around the fuse neck is accomplished by the removal of a sacrificial layer of an oxidizable polymer material in a gaseous and/or plasma state through a small hole in the dielectric referred to as a sacrificial via opening or just "sacrificial via". After removal of the oxidizable polymer material through the sacrificial via, the sacrificial via must be sealed to prevent damage to the underlying structure from contaminants. The sacrificial via is then sealed with a passivation layer formed of a polymeric material. The details of the method for creating the air gap and sealing the air gap sacrificial via opening are described below.

The structure of the air-gapped B-fuse or air-gapped Ab-fuse comprises two additional portions related to the air gap: a horizontal portion which contains the air gap which provides the space over, below or both over and below the B-fuse (in which case the air space effectively completely surrounds the B-fuse neck), and a vertical portion which contains the sacrificial via which serves as the access to the air gap during air-gapped device fabrication.

The process for creating air gaps requires the use of sacrificial vias which must be sealed after the air gap has been created. The creation of the air-gapped B-fuse and the air-gapped Ab-fuse structure involves the insertion of additional steps before and after the fuse body is defined, namely, an air gap sacrificial material layer before fuse material deposition, and an air gap sacrificial material layer after fuse mask, a sacrificial via mask, and a sacrificial via seal layer. Specifically the sacrificial material is first applied and defined below the fuse neck and then covered with the fuse material which is then patterned with the fuse mask. The sacrificial air gap material below the patterned fuse is not effected by the fuse pattern etch. A second sacrificial air gap material is applied and defined above the patterned fuse neck, and then covered with appropriate dielectric, and finally accessed under the dielectric through a hole or via defined by the sacrificial via mask. The sacrificial polymer material below the dielectric is etched and removed through the sacrificial via opening to form the air gap. The air gap can either completely surround the fuse neck or be confined to only the volume above or below the fuse neck if one of the sacrificial air gap material process steps is not used. After the air gap has been formed the sacrificial via opening must be sealed to protect the air gap and fuse from the chemistry of the remaining process steps and to allow fabrication of additional device layers. The integration of the air gap and sacrificial via sealing into the current process requires the following additional processing steps: (1) Air gap definition; (2) Air gap evacuation with oxygen plasma; (3) Optionally: Surface priming with either SF6 plasma or HMDS vapor (or equivalent) prior to application of the sacrificial via sealing polymer; (4) the application of the sealing polymer; and (5) and the curing of the sealing polymer. The application of the sealing polymer can replace or augment the standard CVD deposition step for passivation.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The present invention comprises two aspects. According to the first aspect, a novel two-terminal Ab-fuse comprising a horizontal B-fuse and a vertical A-fuse disposed between a first and a second metallization layer of an integrated circuit is provided. According to the second aspect of the invention, a B-fuse and the B-fuse portion of an Ab-fuse are provided with an air gap and a method for fabricating devices including the air gap is taught.

Figure 3:
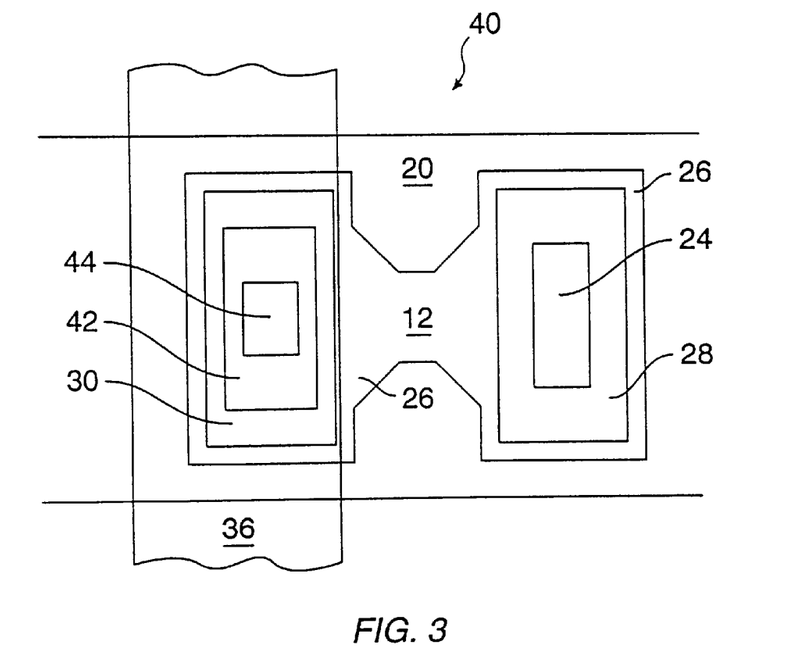
FIGS 3 and 4 depict a two-terminal Ab-fuse device according to a first aspect of the present invention.
Figure 4:
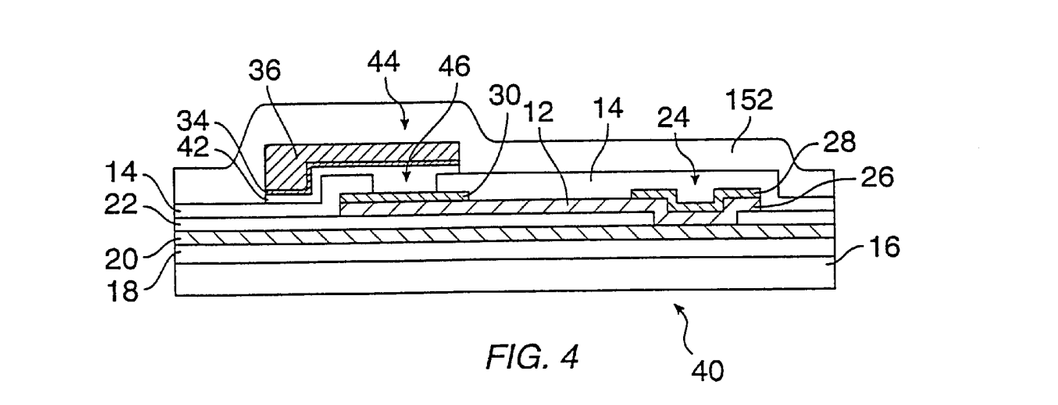

Turning now to the first aspect of the invention, FIGS. 3 and 4 depict, respectively, a top and a cross-sectional view of a two-terminal Ab-fuse 40. The structure of Ab-fuse 40 is built over a substrate 16, first oxide layer 18 and first metallization layer 20. A second oxide layer 22 is disposed over first metallization layer 20. A first via 24 is opened in oxide layer 22 to obtain access to first metallization layer 20. A conductive fuse material layer 26 is disposed over second oxide layer 22 and via 24. TiW plugs 28, 30 are disposed over the fuse material layer 26, respectively, in the region of first via 24 and what is to become second via 44. A third oxide layer 14 is disposed over the second oxide layer 22, the fuse material layer 26 and TiW plugs 28, 30. A second via 44 is opened through third oxide layer 14 and an amorphous silicon antifuse layer 42 is deposited in a second via 44 to form a vertical antifuse 46. A TiW barrier layer 34 is deposited. Second metallization layer 36 is deposited over TiW barrier layer 34 to provide electrical contact to the B-fuse structure 40. As can be seen in these figures, there is no air gap above, below, or surrounding fuse neck 12. The oxide layer 14 is in direct contact with the B-fuse material layer 26. Neither the antifuse 46 nor the B-fuse neck 12 has been blown in FIGS. 3, 4. This structure is useful for devices intended to carry currents on the order of 0–25 mA and is programmable with B-fuse programming currents on the order of 50–500 mA.

When large current capacity/low resistance B-fuses (i.e., those carrying currents greater than 25 mA and programmable with B-fuse programming currents on the order of 0.5–4.0 A) are required, a new structure is required since the high level of energy required to blow the fuse (on the order of 1 $\mu$Joule), will tend to melt and destroy or rupture the oxide layer 14 which is in direct contact with the fuse material layer 26 in the vicinity of fuse neck 12 where the fuse is most likely to actually blow. It is for use with these devices that the air gap described below was developed.

Turning now to the second aspect of the present invention, a method for creating an air gap and then sealing the air gap which may be either above, below, or completely surrounding a programmable B-fuse element is provided. The opening into the air gap which has to be sealed is referred to as the "Sacrificial Via" opening. The programmable fuse element which is surrounded by the air gap is referred to as a B-fuse which is part of the Ab-fuse structure.

The structure of air-gapped fuse or air-gapped Ab-fuse comprises two additional portions related to the air gap: a horizontal portion which contains the air gap which completely surrounds the fuse neck or which may be only above or below the fuse neck, and a vertical portion which contains the sacrificial via, which must be sealed to protect the air gap from contaminants and provide a level surface for later fabrication steps.

Figure 5:
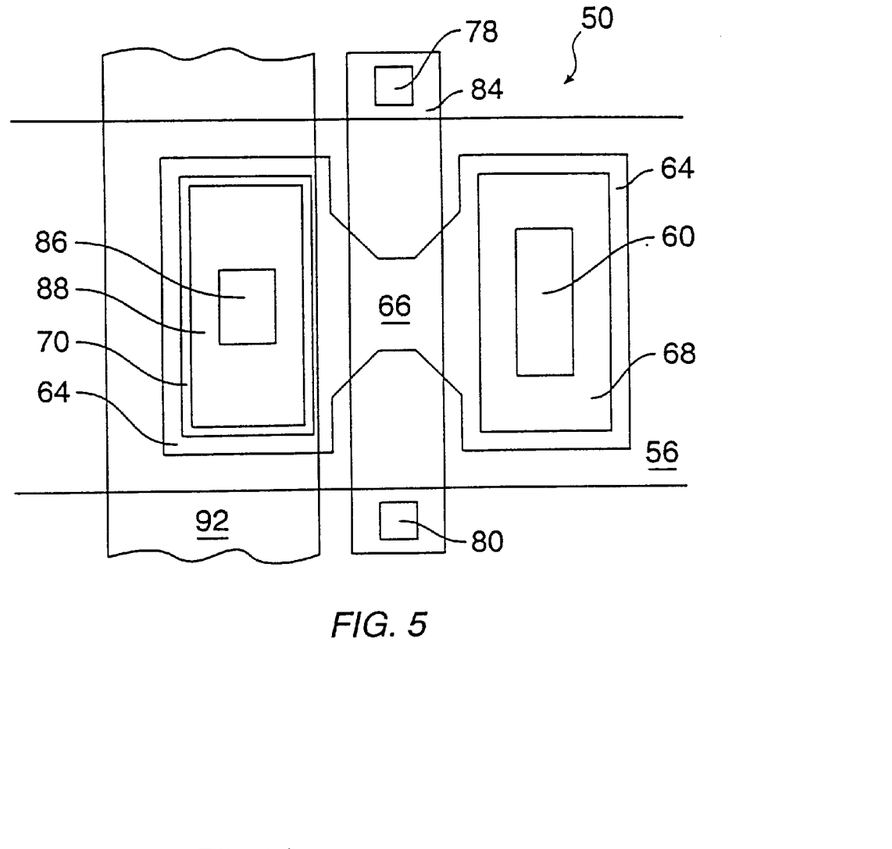
FIGS. 5 and 6 depict a novel Ab-fuse device having an air gap surrounding the B-fuse portion of the device.
Figure 6:
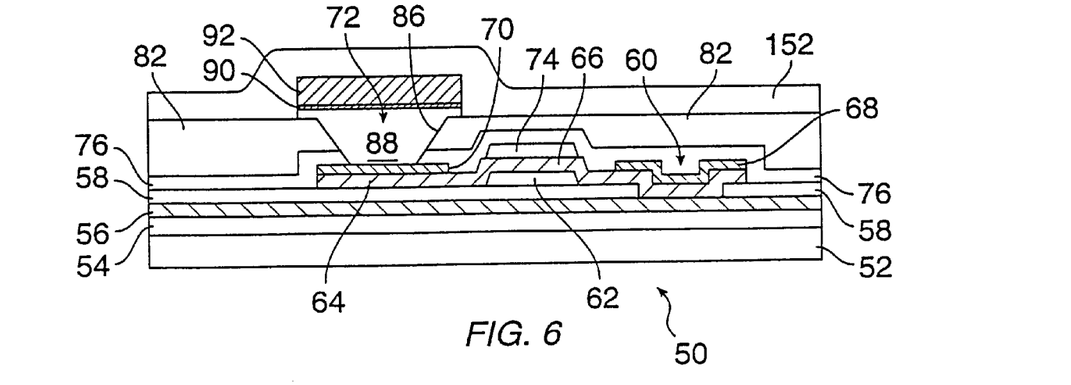

Depending on the placement of the sacrificial via, two types of cells can be conveniently classified: namely, (1) the basic tunnel and hole (sacrificial via) cell, and (2) the fuse-end sacrificial-via cell. The first type cell, featuring a bar-shaped air gap mask (tunnel) with sacrificial vias (holes) located outside the fuse, is shown in FIGS. 5–6 for the Ab-fuse structure. The same type of tunnel and hole structure can exist for the B-fuse alone without the presence of the A-Fuse. The second type cell features mainly a rectangular air gap mask with the sacrificial via located over the first via contact. This is shown in FIGS. 7–10 for the Ab-fuse structure. The same type of air gap may also be made for the B-fuse alone.

Both the basic tunnel and sacrificial via cell, and the rectangular air chamber and sacrificial via over the first via cell, are of simple design, and both require two additional masks for the case where the air gap is only above the fuse neck, and three additional masks if the air gap completely surrounds the fuse neck. Either type of cell provides a means of realizing the air gap concept for both B-fuse and Ab-fuse structures.

While there may be differences in the device layout of these two types of cells, the vertical structure is essentially the same. A layer by layer description of the air-gapped Ab-fuse structure is given in the table below:

TABLE 1

Air-gapped Ab-fuse device structure (With reference to FIGS. 5 and 6)

| Layer | Preferred Embodiment | Alternatives |
|---|---|---|
| Substrate (52) | Si wafer (any type) | Any rigid material, conductor, semiconductor or insulator, which can sustain moderate temperature processing, typically on the order of 400° C. |
| Layer 1 (54) | thermal oxide 2.0 $\mu$m | Any dielectric of appropriate thickness, grown or deposited, e.g., nitride, oxide, spin-on-glass ("SOG") or polyimide |
| Layer 2 (56) | Aluminum 1.5 $\mu$m | Any metal conductor, e.g., Cu, Au, Mo, W. |
| Layer 3 (58) | Low Temperature Oxide ("LTO") 1.5 $\mu$m | Any dielectric of appropriate thickness, e.g., nitride, oxide, SOG or polyimide |
| Layer 3A (62) | Polyimide 1.0 $\mu$m | Any sacrificial material of appropriate thickness. (Optional layer (used only when an air gap beneath the fuse is desired): underside air gap polyimide is etched away) |
| Layer 4 (64) | Fuse metal | Any metal conductor with or without adhesion layer and with desired fuse characteristics, appropriate thickness, e.g., Cu, Cr, Ni, Ta, Mo, and W. |
| Layer 5 (68,70) | Via plug | Any metal conductor with desired barrier (optional layer) and step coverage properties, e.g., Ta, TiW. |
| Layer 6 (74) | Polyimide 1.0 $\mu$m | Any sacrificial material of appropriate thickness. The polyimide is etched away through the sacrificial via by an oxygen plasma to form the air gap. |
| Layer 7 (76) | LTO 0.6 $\mu$m | Any dielectric of appropriate thickness, e.g., nitride, oxide or SOG. |
| Layer 8 (88) | Anti-fuse material | Any insulator, single or layered and with desired antifuse characteristics, e.g., nitride, oxide or amorphous silicon ("a-Si") |
| Layer 9 (92) | Aluminum 2.0 $\mu$m | Any metal conductor, e.g., Cu, Au, Mo, W. May also include a barrier metal layer 90 of TiW or Ta as is well known in the art. |
| Layer 10 (82) | Polyimide 2.0 $\mu$m | Any dielectric, good for air gap seal. |
| Layer 11 (152) | PECVD nitride 1.0 $\mu$m | Any dielectric, single or layered of appropriate passivation property, e.g., oxide, oxynitride or polyimide. |

The method of realizing the structure of the air-gapped fuse and Ab-fuse, includes the following general steps: first, the application and definition of sacrificial material both below and over the fuse neck; second, covering the fuse and sacrificial material with appropriate dielectric; and third, accessing and etching away the sacrificial material through a photo defined hole (defined as a sacrificial via) in the dielectric to form the air gap (under the dielectric). This air gap under the dielectric may completely surround the fuse neck, or in some cases may be just above or below the fuse neck. Finally, the sacrificial via will be sealed by (1) Optionally priming the oxide surface with HMDS vapor (while this step is not always necessary, it does enhance the surface tension); (2) spinning on the polyimide material to seal the opening; and (3) elevating temperature curing cycle to the curing temperature of the chosen material. Presently preferred is the polyimide material known as WE-1111 which is available from DuPont and which cures at a temperature of 350–450° C. A layer of it 1.0 $\mu$m thick may be etched out through a sacrificial via hole of diameter 3×3 $\mu$m with an oxygen plasma in approximately 60 minutes.

Depending on both the cell types used and materials chosen for creating the air gap structure, there are many possible implementations of the above general steps in the Ab-fuse fabrication process. As an example, a step by step process flow of realizing an air-gapped Ab-fuse is given in the table below.

TABLE 2

Figure 9:
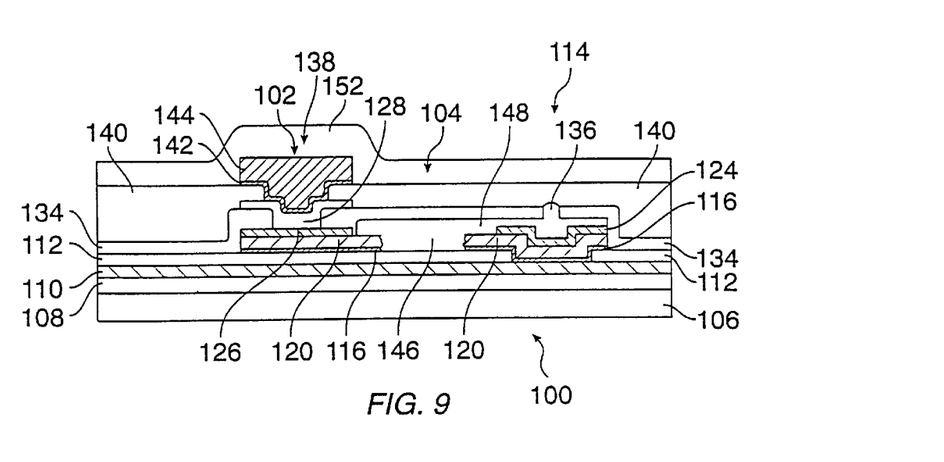
FIGS. 9 and 10 depict another novel Ab-fuse device having an air gap above the B-fuse portion of the device.
Figure 10:
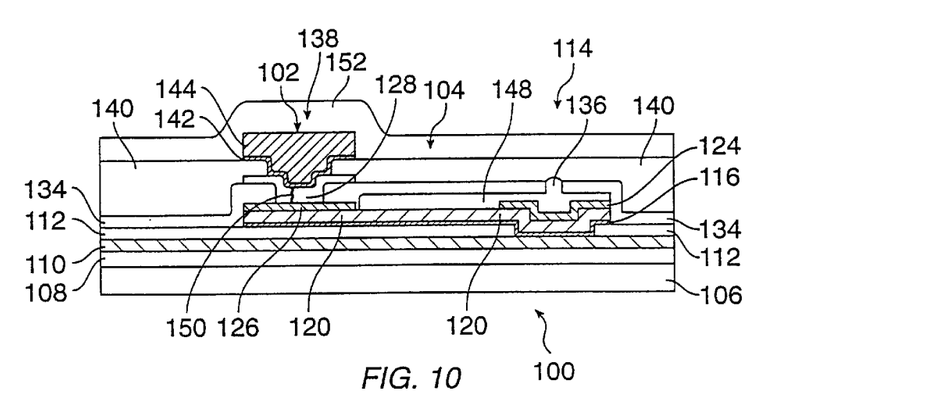

Tunnel and hole air-gapped Ab-fuse device process flow
(With reference to FIGS. 9 and 10)

| Step | Preferred Embodiment | Alternatives |
|---|---|---|
| Substrate | Si wafer (any type) | Aluminum discs, glass substrates |
| 1 | Deposit Layer 1 (108): thermal oxidation | PECVD oxide deposition or polyimide spin-on |
| 2 | Deposit Layer 2 (110): Aluminum sputtering | Cu, Au plating or sputtering |
| 4 | Metal 1 (110) mask and etch | |
| 5 | LTO1 (112) deposition | PECVD oxide deposition or polyimide spin-on and curing. |
| 6 | Via 1 (114) mask and etch | |
| 7 | Fuse material (120) deposition TiW sputter, Ni plate | Ti, Cr, W, other metals |
| 8 | Fuse mask and etch | |
| 9 | TiW Plug material (124, 126) deposition | Ta, TIN, W, other barrier materials |

TABLE 2-continued

Tunnel and hole air-gapped Ab-fuse device process flow
(With reference to FIGS. 9 and 10)

| Step | Preferred Embodiment | Alternatives |
|---|---|---|
| 10 | Plug mask and etch | Ni plating |
| 11 | Sacrificial material (148) deposition (polyimide) | Sacrificial material deposition (a-Si (amorphous silicon), PECVD oxide, positive photoresist, Cr, etc.) |
| 12 | Air gap (148) mask | |
| 13 | LTO2 (134) deposition | Silicon nitride plasma CVD |
| 14 | Via 2 (138) and Sacrificial Via (136) mask and etch | |
| 15 | Anti-fuse material (128) deposition (Amorphous Silicon) | Other dielectrics such as oxide, nitride and combinations thereof. |
| 16 | Anti-fuse mask and etch (102) | |
| 17 | Sacrificial material etch with oxygen plasma | |
| 17a | Optionally: HMDS Vapor or SF6 Plasma Prime | |
| 18 | Polyimide (140) Application | CVD Oxide, CVD Nitride, combination of 2 or 3 of: oxide, nitride and polyimide |
| 19 | Polyimide Cure | |
| 20 | Via 3 mask and etch | |
| 21 | Metal 2 (142, 144) deposition by sputtering TiW and Al | Cu, Au plating |
| 22 | Metal 2 mask and etch | |
| 23 | Apply passivation layer (152) of PECVD nitride (1.0 micron) | Alt: Any dielectric, single or layered, of appropriate passivation property, e.g., oxide, oxynitride, polyimide or combinations thereof. |
| 24 | Pad mask and etch to open pad for wire bonding through passivation layer. | |

During the fuse programming event material from the fuse neck is heated by the programming current pulse to reach its melting point, the melt is unstable and will tend to agglomerate toward the end tabs of the fuse. This tendency can be impeded if little or no free volume is available by the fuse neck. Consequently by providing free air gap space for the fuse material to move into, the air-gapped B-fuse and the air-gapped Ab-fuse should generally be more reproducible in terms of their respective programming characteristics and have higher programming yield than such devices manufactured without the benefit of the air gap structure. Furthermore, the dielectric around the air-gapped B-fuse and air-gapped Ab-fuse will remain intact throughout the fuse programming event, thus permitting functional fuses to be built under metal bumps or other massive structures which could be damaged by displacement of the dielectric as often occurs in prior art fuses. To illustrate the above point a programmed air-gapped B-fuse and a programmed air-gapped Ab-fuse are shown in FIG. 9 and FIG. 10 respectively.

Turning now in detail to the drawings, FIGS. 5 and 6 depict a novel Ab-fuse structure 50 according to a presently preferred embodiment of the present invention. Both the A-fuse (antifuse) and B-fuse (fuse) of the devices of FIGS. 5 and 6 are unprogrammed (un-blown). This preferred embodiment is referred to herein as the "tunnel and hole" structure. Ab-fuse 50 is constructed over substrate 52 as follows. A first oxide layer 54 and a first metallization layer 56 are constructed over substrate 52. A first ILD oxide layer 58 is constructed over first metallization layer 56. A first via 60 is etched into first ILD oxide layer.

It is possible to create an air gap above, below, or both above and below the fuse. Obviously, the more energy that is expected to be dissipated during a fuse blowing incident, the more air gap volume is desired. Where less air gap volume is desired, some steps may be saved by only constructing the air gap above or below (and not both above and below) the fuse structure. This discussion will describe an air gap constructed both above and below the fuse structure. Those of ordinary skill in the art will readily realize which steps would be rendered unnecessary if only a partial air gap is desired.

As shown in FIGS. 5 and 6, in order to implement the "below-fuse" air gap using the present invention, after first via 60 is etched into first ILD oxide layer 58, deposit a first patterned polymeric layer 62 of a polymeric material such as DuPont Polyimide WE-1111. This can be any material which can withstand processing temperatures of up to about 400° C. and which can later be etched away without etching the fuse metal. First patterned polymeric layer 62 will serve as a support for succeeding layers, then will be removed leaving the air gap behind. Over first ILD oxide layer 58 and first patterned polymeric layer 62, deposit fuse material layer 64 comprising necked fuse region 66. Over fuse material layer 64 is deposited first TiW plug 68 in the region of first via 60 and second TiW plug 70 in the region of what will become antifuse 72. A second patterned polymeric layer 74 is deposited over fuse material layer 64 and second ILD oxide layer 76 is deposited over the region of the Ab-fuse 50.

The second via 86 can be masked and etched either before etching the sacrificial via or before antifuse material deposition.

In order to evacuate the first and second patterned polymeric layers 62, 74, first and second sacrificial vias 78, 80 are etched to penetrate second ILD oxide layer 76 to access first and second patterned polymeric layers 62 and 74. These layers are the etched with an oxygen plasma and, as a result, the polymer is extracted through sacrificial vias 78, 80 and sacrificial vias 78, 80 are then sealed by the deposition of polyimide layer 82. This process leaves a tunnel shaped air gap 84 both above and below necked fuse region 66 as diagrammed in FIG. 5. Those of ordinary skill in the art will realize that either the upper or the lower air gap could be omitted where not needed.

Next polyimide layer 82 is etched back in the region of antifuse 72 to form second via 86 which penetrates down to second TiW plug 70. An antifuse material layer 88, preferably of amorphous silicon, is deposited in second via 86 and patterned and etched using standard photolithography techniques. TiW barrier layer 90 is deposited over antifuse material layer 88 in order to protect the amorphous silicon, and a second metallization layer 92, preferably of aluminum, is deposited over TiW barrier layer 90.

According to the above-described preferred embodiment, the presently preferred layer thickness ranges are set forth below in Table 3.

TABLE 3

(With Reference to FIGS. 5 and 6)

| Ref. No. | Description | Thickness in Angstroms |
|---|---|---|
| 54 | first oxide layer | 20000 |
| 56 | first metallization layer | 11000 |
| 58 | first ILD oxide layer | 14000 |
| 62 | first patterned polymeric layer | 14000 |

TABLE 3-continued (With Reference to FIGS. 5 and 6)

| Ref. No. | Description | Thickness in Angstroms |
|---|---|---|
| 64 | fuse material layer (preferably Ni with an adhesive layer of 50–200 Å of TiW on the bottom, under the fuse) | 3300 (+50–200) |
| 68 | first TiW plug | 3000 |
| 70 | second TiW plug | 3000 |
| 74 | second patterned polymeric layer | 18000 |
| 76 | second ILD oxide layer | 9000 |
| 82 | polyimide layer | 18000 |
| 88 | antifuse material layer | 6800 |
| 90 | TiW Barrier Layer | 2000 |
| 92 | second metallization layer | 20000 |
| 152 | passivation layer | 12000–20000 |

Figure 7:
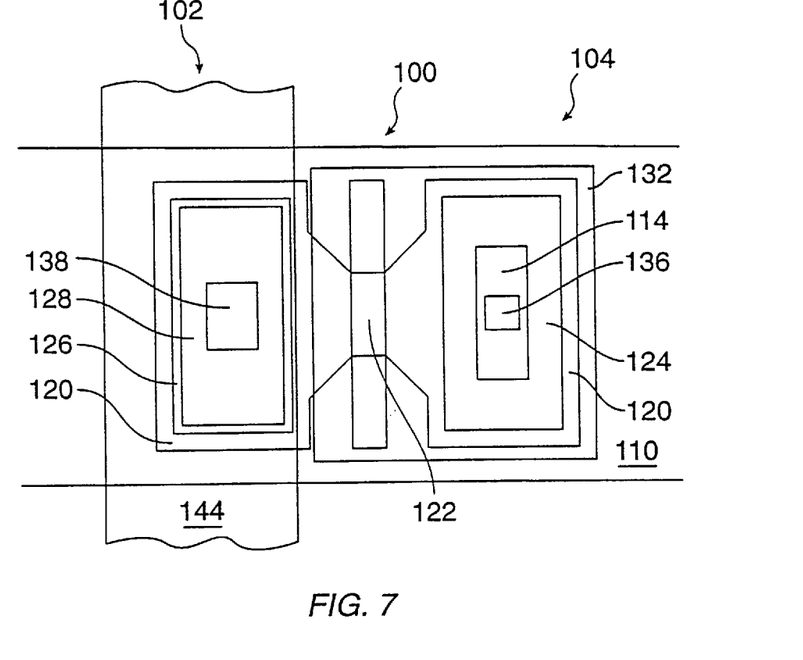
FIGS. 7 and 8 depict another novel Ab-fuse device having an air gap surrounding the B-fuse portion of the device.
Figure 8:
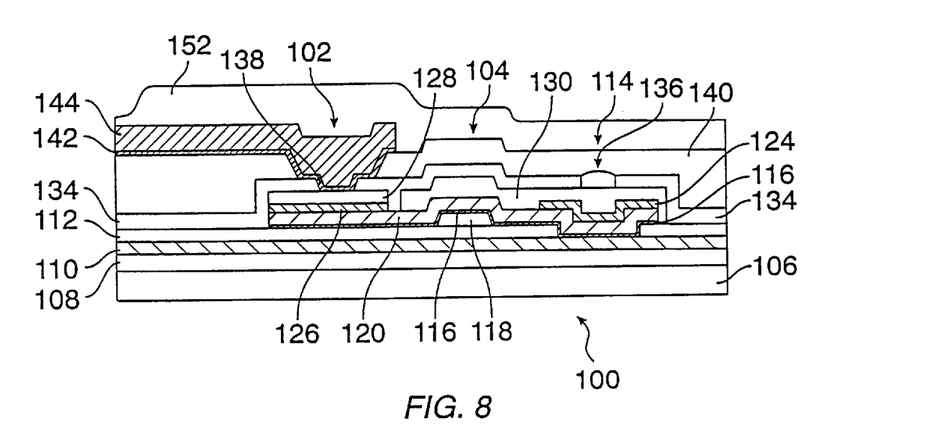

Turning now to FIGS. 7 and 8, a modification of the air-gapped fuse structures of FIGS. 5 and 6 is shown. Here Ab-fuse structure 100 comprises an A-fuse or antifuse structure 102 and a B-fuse or fuse structure 104 which includes an air gap. Briefly, the Ab-fuse is constructed on substrate 106. Oxide layer 108 is formed over substrate 106 and first metallization layer 110 is deposited over oxide layer 108. First ILD oxide layer 112 is deposited over first metallization layer 110 and is then etched to form first via 114. First patterned polymeric layer 118 is deposited as described before. Adhesive layer (TiW preferred) layer 116 is deposited over first ILD oxide layer 112 as shown. Fuse material layer 120 is deposited over adhesive layer 116 and first patterned polymeric layer 118 which raises fuse material layer 120 in the vicinity of B-fuse neck 122 as shown. First TiW plug 124 and second TiW plug 126 are then deposited on top of fuse material layer 120. Amorphous silicon antifuse layer 128 is deposited over second TiW plug 126 as shown. Second patterned polymeric layer 130 is then deposited over a wide area 132 encompassing fuse neck 122 and first via 114. Second ILD oxide layer 134 is then deposited over second patterned polymeric layer 130 and antifuse layer 128. Second ILD oxide layer 134 is then etched to form one or more sacrificial vias 136 and second via 138 where antifuse 102 will be located. The polymeric material which comprises first and second patterned polymeric layers 118 and 130 is now vaporized and removed through the sacrificial via 136. The sacrificial via 136 is sealed with polyimide layer 140. This, in turn, is etched back in the vicinity of second via 138 to expose antifuse layer 128. In turn, TiW barrier layer 142 is deposited over antifuse layer 128. Second metallization layer 144 is deposited over TiW barrier layer 142 as shown.

As can be seen, neither the fuse 104 nor the antifuse 102 is blown in these figures. The drawings illustrate the rectangular air gap with the sacrificial via 136 over the first via contact area. In this particular embodiment (FIG. 8), the amorphous silicon antifuse material was located below the second via contact instead of above the second via contact as depicted in FIG. 6. There is a large rectangular shaped air gap 130 above B-fuse 104 and a small air gap 118 located below B-fuse 104. The polymer which defines the air space below and above the fuse neck is removed through the sacrificial via 136 located over the first via contact. The sacrificial via 136 is then sealed off after all of the polymer has been removed to form the air gap around the fuse neck. To enhance the surface tension of the polyimide, the surface of the second ILD oxide layer 134 may optionally be primed with HDMS vapor prior to the application of the polyimide layer 140 which seals the sacrificial via opening 136. Such priming is not always necessary and is not presently preferred. After the polyimide has been spun on the surface, it must be soft-cured prior to the via mask step to initiate the imidization reaction which hardens the polyimide polymer in place.

Turning to FIG. 9, a programmed B-fuse (B-fuse is blown at 146) is shown. In this illustration the antifuse is located above the second via contact area. The sacrificial via 136 is located over the first via contact area. The air gap according to this embodiment is located only above the B-fuse neck as shown at 148. There is no air gap here below the B-fuse neck.

Turning to FIG. 10, a programmed A-fuse (A-fuse is blown at 150) with the B-fuse intact and not blown is shown. In this illustration the antifuse is located above the second via contact area. The sacrificial via 136 is located over the first via contact area. The air gap according to this embodiment is located only above the B-fuse neck as shown at 148. There is no air gap here below the B-fuse neck.

Preferably a passivation layer 152 of an oxide, an oxynitride, a nitride, a polyimide, or a combination of the foregoing, of thickness preferably in the range of 12000–20000 angstroms is applied to passivate the chip. Presently preferred is PECVD nitride.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An integrated circuit device having a first and a second metallization layer separated by a dielectric comprising a first dielectric layer and a second dielectric layer disposed over said first dielectric layer, said second metallization layer located above said first metallization layer, and a B-fuse structure disposed between said first metallization layer and said second metallization layer, said B-fuse comprising:

a first via opening in said first dielectric layer, said first via opening penetrating said first dielectric layer to provide electrical access to said first metallization layer;

a fuse material layer disposed over said first dielectric layer and in said first via opening, said fuse material layer in electrical contact with said first metallization layer and said fuse material layer including a necked portion configured to blow upon application of a predetermined current across said necked portion;

said necked portion disposed vertically adjacent an air gap;

a second via opening in said second dielectric layer, said second via opening penetrating said second dielectric layer to contact said fuse material layer;

an electrically conductive material disposed in said second via opening forming a conductive path from said second metallization layer to said fuse material layer;

said second dielectric layer including at least one sacrificial via opening therethrough;

said second dielectric layer covered with a passivation layer of a polyimide material which seals said sacrificial via opening.

2. An integrated circuit according to claim 1 wherein said air gap is below said necked portion.

3. An integrated circuit according to claim 1 wherein said air gap is above said necked portion.

4. An integrated circuit according to claim 1 wherein said air gap is both below and above said necked portion.

5. An integrated circuit device having a first and a second metallization layer separated by a dielectric comprising a first dielectric layer and a second dielectric layer disposed over said first dielectric layer, said second metallization layer located above said first metallization layer, and an Ab-fuse structure disposed between said first metallization layer and said second metallization layer, said Ab-fuse comprising:

a first via opening in said first dielectric layer, said first via opening penetrating said first dielectric layer to provide electrical access to said first metallization layer;

a fuse material layer disposed over said first dielectric layer and in said first via opening, said fuse material layer in electrical contact with said first metallization layer and said fuse material layer including a necked portion configured to blow upon application of a predetermined current across said necked portion;

said necked portion disposed vertically adjacent an air gap;

a second via opening in said second dielectric layer, said second via opening in and through said second dielectric layer to provide electrical access to said fuse material layer;

an antifuse material layer having a top and a bottom disposed in said second via opening, said top of said antifuse material layer in electrical contact with said second metallization layer and said bottom of said antifuse material layer in electrical contact with said fuse material layer, said antifuse material layer configured to conduct electricity upon application of a predetermined voltage across said top and said bottom of said antifuse material layer;

said second dielectric layer including at least one sacrificial via opening therethrough;

said second dielectric layer covered with a passivation layer of a polyimide material which seals said sacrificial via opening.

6. An integrated circuit according to claim 5 wherein said air gap is below said necked portion.

7. An integrated circuit according to claim 5 wherein said air gap is above said necked portion.

8. An integrated circuit according to claim 5 wherein said air gap is both below and above said necked portion.

9. An integrated circuit device having a first and a second metallization layer separated by a dielectric comprising a first dielectric layer and a second dielectric layer disposed over said first dielectric layer, said second metallization layer located above said first metallization layer, and an Ab-fuse structure disposed between said first metallization layer and said second metallization layer, said Ab-fuse comprising:

a first via opening in said first dielectric layer, said first via opening penetrating said first dielectric layer to provide electrical access to said first metallization layer;

a fuse material layer disposed over said first dielectric layer and in said first via opening, said fuse material layer in electrical contact with said first metallization layer and said fuse material layer including a necked portion configured to blow upon application of a predetermined current across said necked portion;

said necked portion disposed vertically adjacent an air gap;

a second via opening in said second dielectric layer, said second via opening in and through said second dielectric layer to provide electrical access to said fuse material layer;

an antifuse material layer having a top and a bottom disposed adjacent said second via opening, said top of said antifuse material layer in electrical contact with said second metallization layer and said bottom of said antifuse material layer in electrical contact with said fuse material layer, said antifuse material layer configured to conduct electricity upon application of a predetermined voltage across said top and said bottom of said antifuse material layer;

said second dielectric layer including at least one sacrificial via opening therethrough, said at least one sacrificial via opening disposed in a plane vertically intersecting said necked portion;

said second dielectric layer covered with a passivation layer of a polyimide material which seals said sacrificial via opening.

10. An integrated circuit according to claim 9 wherein said antifuse material layer is disposed in said second via.

11. An integrated circuit according to claim 9 wherein said antifuse material layer is disposed under said second via.

12. An integrated circuit according to claim 9 wherein said air gap is below said necked portion.

13. An integrated circuit according to claim 9 wherein said air gap is above said necked portion.

14. An integrated circuit according to claim 9 wherein said air gap is both below and above said necked portion.

15. An integrated circuit device having a first and a second metallization layer separated by a dielectric comprising a first dielectric layer and a second dielectric layer disposed over said first dielectric layer, said second metallization layer, located above said first metallization layer, and an Ab-fuse structure disposed between said first metallization layer and said second metallization layer, said Ab-fuse comprising:

a first via opening in said first dielectric layer, said first via opening penetrating said first dielectric layer to provide electrical access to said first metallization layer;

a fuse material layer disposed over said first dielectric layer and in said first via opening, said fuse material layer in electrical contact with said first metallization layer and said fuse material layer including a necked portion configured to blow upon application of a predetermined current across said necked portion;

said necked portion disposed vertically adjacent an air gap;

a second via opening in said second dielectric layer, said second via opening in and through said second dielectric layer to provide electrical access to said fuse material layer;

an antifuse material layer having a top and a bottom disposed adjacent said second via opening, said top of said antifuse material layer in electrical contact with said second metallization layer and said bottom of said antifuse material layer in electrical contact with said fuse material layer, said antifuse material layer configured to conduct electricity upon application of a predetermined voltage across said top and said bottom of said antifuse material layer;

said second dielectric layer including a sacrificial via opening therethrough, said sacrificial via opening disposed above said first via opening;

said second dielectric layer covered with a passivation layer of a polyimide material which seals said sacrificial via opening.

16. An integrated circuit according to claim 15 wherein said antifuse material layer is disposed in said second via.

17. An integrated circuit according to claim 15 wherein said antifuse material layer is disposed under said second via.

18. An integrated circuit according to claim 15 wherein said air gap is below said necked portion.

19. An integrated circuit according to claim 15 wherein said air gap is above said necked portion.

20. An integrated circuit according to claim 15 wherein said air gap is both below and above said necked portion.

21. An integrated circuit device having a first and a second metallization layer separated by a dielectric comprising a first dielectric layer and a second dielectric layer disposed over said first dielectric layer, said second metallization layer located above said first metallization layer, and a B-fuse structure disposed between said first metallization layer and said second metallization layer, said B-fuse comprising:

a first via opening in said first dielectric layer, said first via opening penetrating said first dielectric layer to provide electrical access to said first metallization layer;

a fuse material layer disposed over said first dielectric layer and in said first via opening, said fuse material layer in electrical contact with said first metallization layer and said fuse material layer including a necked portion configured to blow upon application of a predetermined current across said necked portion;

said necked portion disposed vertically adjacent an air gap;

a second via opening in said second dielectric layer, said second via opening penetrating said second dielectric layer to contact said fuse material layer;

an electrically conductive material disposed in said second via opening forming a conductive path from said second metallization layer to said fuse material layer;

said second dielectric layer including at least one sacrificial via opening therethrough.

22. An integrated circuit according to claim 21 wherein said air gap is below said necked portion.

23. An integrated circuit according to claim 21 wherein said air gap is above said necked portion.

24. An integrated circuit according to claim 21 wherein said air gap is both below and above said necked portion.

25. An integrated circuit device having a first and a second metallization layer separated by a dielectric comprising a first dielectric layer and a second dielectric layer disposed over said first dielectric layer, said second metallization layer located above said first metallization layer, and an Ab-fuse structure disposed between said first metallization layer and said second metallization layer, said Ab-fuse comprising:

a first via opening in said first dielectric layer, said first via opening penetrating said first dielectric layer to provide electrical access to said first metallization layer;

a fuse material layer disposed over said first dielectric layer and in said first via opening, said fuse material layer in electrical contact with said first metallization layer and said fuse material layer including a necked portion configured to blow upon application of a predetermined current across said necked portion;

said necked portion disposed vertically adjacent an air gap;

a second via opening in said second dielectric layer, said second via opening in and through said second dielectric layer to provide electrical access to said fuse material layer;

an antifuse material layer having a top and a bottom disposed in said second via opening, said top of said antifuse material layer in electrical contact with said second metallization layer and said bottom of said antifuse material layer in electrical contact with said fuse material layer, said antifuse material layer configured to conduct electricity upon application of a predetermined voltage across said top and said bottom of said antifuse material layer;

said second dielectric layer including at least one sacrificial via opening therethrough.

26. An integrated circuit according to claim 25 wherein said air gap is below said necked portion.

27. An integrated circuit according to claim 25 wherein said air gap is above said necked portion.

28. An integrated circuit according to claim 25 wherein said air gap is both below and above said necked portion.

29. An integrated circuit device having a first and a second metallization layer separated by a dielectric comprising a first dielectric layer and a second dielectric layer disposed over said first dielectric layer, said second metallization layer located above said first metallization layer, and an Ab-fuse structure disposed between said first metallization layer and said second metallization layer, said Ab-fuse comprising:

a first via opening in said first dielectric layer, said first via opening penetrating said first dielectric layer to provide electrical access to said first metallization layer;

a fuse material layer disposed over said first dielectric layer and in said first via opening, said fuse material layer in electrical contact with said first metallization layer and said fuse material layer including a necked portion configured to blow upon application of a predetermined current across said necked portion;

said necked portion disposed vertically adjacent an air gap;

a second via opening in said second dielectric layer, said second via opening in and through said second dielectric layer to provide electrical access to said fuse material layer;

an antifuse material layer having a top and a bottom disposed adjacent said second via opening, said top of said antifuse material layer in electrical contact with said second metallization layer and said bottom of said antifuse material layer in electrical contact with said fuse material layer, said antifuse material layer configured to conduct electricity upon application of a predetermined voltage across said top and said bottom of said antifuse material layer;

said second dielectric layer including at least one sacrificial via opening therethrough, said at least one sacrificial via opening disposed in a plane vertically intersecting said necked portion.

30. An integrated circuit according to claim 29 wherein said antifuse material layer is disposed in said second via.

31. An integrated circuit according to claim 29 wherein said antifuse material layer is disposed under said second via.

32. An integrated circuit according to claim 29 wherein said air gap is below said necked portion.

33. An integrated circuit according to claim 29 wherein said air gap is above said necked portion.

34. An integrated circuit according to claim 29 wherein said air gap is both below and above said necked portion.

35. An integrated circuit device having a first and a second metallization layer separated by a dielectric comprising a first dielectric layer and a second dielectric layer disposed over said first dielectric layer, said second metallization layer located above said first metallization layer, and an Ab-fuse structure disposed between said first metallization layer and said second metallization layer, said Ab-fuse comprising:

a first via opening in said first dielectric layer, said first via opening penetrating said first dielectric layer to provide electrical access to said first metallization layer;

a fuse material layer disposed over said first dielectric layer and in said first via opening, said fuse material layer in electrical contact with said first metallization layer and said fuse material layer including a necked portion configured to blow upon application of a predetermined current across said necked portion;

said necked portion disposed vertically adjacent an air gap;

a second via opening in said second dielectric layer, said second via opening in and through said second dielectric layer to provide electrical access to said fuse material layer;

an antifuse material layer having a top and a bottom disposed adjacent said second via opening, said top of said antifuse material layer in electrical contact with said second metallization layer and said bottom of said antifuse material layer in electrical contact with said fuse material layer, said antifuse material layer configured to conduct electricity upon application of a predetermined voltage across said top and said bottom of said antifuse material layer;

said second dielectric layer including a sacrificial via opening therethrough, said sacrificial via opening disposed above said first via opening.

36. An integrated circuit according to claim 35 wherein said antifuse material layer is disposed in said second via.

37. An integrated circuit according to claim 35 wherein said antifuse material layer is disposed under said second via.

38. An integrated circuit according to claim 35 wherein said air gap is below said necked portion.

39. An integrated circuit according to claim 35 wherein said air gap is above said necked portion.

40. An integrated circuit according to claim 35 wherein said air gap is both below and above said necked portion.

41. An integrated circuit device having a first and a second metallization layer separated by a dielectric comprising a first dielectric layer and a second dielectric layer disposed over said fist dielectric layer, said second metallization layer located above said first metallization layer, and an Ab-fuse structure disposed between said first metallization layer and said second metallization layer, said Ab-fuse comprising:

a first via opening in said first dielectric layer, said first via opening penetrating said first dielectric layer to provide electrical access to said fist metallization layer, a fuse material layer disposed over said first dielectric layer and in said first via opening, said fuse material layer in electrical contact with said first metallization layer and said fuse material layer including a necked portion configured to blow upon application of a predetermined current across said necked portion;

a second via opening in said second dielectric layers said second via opening penetrating said second dielectric layer to contact said fuse material layer;

an antifuse material layer having a top and a bottom, said antifuse material layer disposed adjacent said second via opening, said top of said antifuse material layer in electrical contact with said second metallization layer and said bottom of said antifuse material layer in electrical contact with said fuse material layer, said antifuse material layer configured to conduct electricity upon application of a predetermined voltage across said top and said bottom of said antifuse material layer.

42. An integrated circuit device having a first and a second metallization layer separated by a dielectric comprising a first dielectric layer and a second dielectric layer disposed over said first dielectric layer, said second metallization layer located above said first metallization layer, and an Ab-fuse structure disposed between said first metallization layer and said second metallization layer, said Ab-fuse structure comprising:

a first via opening in and through said first dielectric layer, a fuse material layer disposed over said first dielectric layer and in said first via opening, said fuse material layer in electrical contact with said fast metallization layer, said fuse material layer including a necked portion configured to blow upon application of a predetermined current across said necked portion;

an antifuse material layer having a top and a bottom, said bottom of said antifuse material layer in electrical contact with said fuse material layer;

a second via opening in and through said second dielectric layer, and an electrically conductive path from said second metallization layer, through said second via, to said top of said antifuse material layer, said antifuse material layer configured to conduct electricity upon application of a predetermined voltage across said top and said bottom of said antifuse material layer.

43. An integrated circuit according to claim 41 wherein said antifuse material layer is disposed in said second via.

44. An integrated circuit according to claim 41 wherein said antifuse material layer is disposed under said second via.

45. An integrated circuit device according to claim 41 further including a first layer of an electrically conductive barrier material disposed between said bottom of said antifuse material layer and said fuse material layer.

46. An integrated circuit device according to claim 45 therein said electrically conductive barrier material is TiW.

47. An integrated circuit device according to claim 45 further comprising a second layer of an electrically conductive barrier layer disposed between said top of said antifuse material layer and said second metallization layer.

48. An integrated circuit device according to claim 41 further including a layer of an electrically conductive material disposed over said fuse material layer above said first via opening.

49. An integrated circuit device according to claim 47 wherein said electrically conductive barrier material is TiW.

50. An integrated circuit according to claim 49 wherein said antifuse material layer comprises amorphous silicon.

51. An integrated circuit according to claim 49 wherein said fuse material layer comprises nickel.

52. An integrated circuit according to claims 41, 42, 1, 5, 9, 15, 21, 25, 29 or 35 wherein the integrated circuit is further passivated and sealed with a dielectric film of at least one material selected from the group consisting of: oxide, nitride, oxynitride, and polyimide.

* * * * *